(12) United States Patent
Lin et al.

(10) Patent No.: US 7,589,373 B2
(45) Date of Patent: Sep. 15, 2009

(54) SEMICONDUCTOR DEVICE

(75) Inventors: Cha-Hsin Lin, Tainan (TW);
Lurng-Shehng Lee, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/353,244

(22) Filed: Jan. 13, 2009

(65) Prior Publication Data
US 2009/0114975 A1 May 7, 2009

Related U.S. Application Data

(62) Division of application No. 11/309,696, filed on Sep. 15, 2006, now Pat. No. 7,498,631.

(30) Foreign Application Priority Data
Jul. 18, 2006 (TW) ................ 95126166 A

(51) Int. Cl.
*H01L 29/94* (2006.01)

(52) U.S. Cl. ............ 257/314; 257/303; 257/306; 257/316; 257/321; 257/344; 257/366; 257/E21.179; 257/E21.422; 438/253; 438/258; 438/261; 438/279

(58) Field of Classification Search ........... 257/227, 257/366; 438/183, 246, 347
See application file for complete search history.

(56) References Cited

U.S. PATENT DOCUMENTS
5,910,667 A * 6/1999 Hsu .................. 257/306
2004/0227180 A1 * 11/2004 Huang et al. ........... 257/324

* cited by examiner

*Primary Examiner*—N Drew Richards
*Assistant Examiner*—Kyoung Lee
(74) *Attorney, Agent, or Firm*—Jianq Chyun IP Office

(57) ABSTRACT

The present invention provides a semiconductor device, which includes a substrate and a sensing memory device. The substrate includes a metal-oxide-semiconductor transistor having a gate. The sensing memory device is disposed on the gate of the metal-oxide-semiconductor transistor and includes followings. The second conductive layer is covering the first conductive layer. The charge trapping layer is disposed between the first conductive layer and the second conductive layer, wherein the first conductive layer has a sensing region therein when charges stored in the charge trapping layer, and the sensing region is adjacent to the charge trapping layer. The first dielectric layer and the second dielectric layer are respectively disposed between the charge trapping layer and the first conductive layer and between the charge trapping layer and the second conductive layer, wherein a third dielectric layer is disposed between the gate and the sensing memory device.

17 Claims, 6 Drawing Sheets

US 7,589,373 B2

SEMICONDUCTOR DEVICE

CROSS-REFERENCE TO RELATED APPLICATION

This application is a divisional of an application Ser. No. 11/309,696, filed on Sep. 15, 2006, now pending, which claims the priority benefit of Taiwan application serial no. 95126166, filed on Jul. 18, 2006. The entirety of each of the above-mentioned patent applications is hereby incorporated by reference herein and made a part of this specification.

BACKGROUND OF THE INVENTION

1. Field of the Invention

The present invention relates to a semiconductor device. More particularly, the present invention relates to a semiconductor device having a sensing memory device.

2. Description of Related Art

Along with the development of the communication technology and the popularity of the Internet, the requirements of the people on the communication and process of the information especially on the audio-visual data transmission of great capacity and quick transmission speed are accelerated. On the other aspect, under the global competition, the work environment is not limited to the office, but anywhere in the world at any time, at this point, a great deal of information is needed to support this action and decision. Therefore, the requirements on the portable digital apparatus including the mobile platforms such as a digital notebook computer/NB, a personal digital assistant/PDA, an electronic book/e-book, a mobile phone and a digital camera/DSC is increasing significantly. Thus, the requirements on the storage apparatuses for accessing the above digital products increase significantly as well.

Since 1990, the semiconductor storage-based memory is developed, which now becomes a new technology of the storage medium. In order to satisfy the requirements on the continuous increasing of memory along with the storage or transmission of a great deal of data, developing a new type of the memory device is of great importance and value.

SUMMARY OF THE INVENTION

In view of this, an objective of the present invention is to provide a semiconductor device, which can be applied in volatile and non-volatile memories.

Another objective of the present invention is to provide a semiconductor device, which has a simple structure, thus making the memory have a higher integration.

The present invention provides a semiconductor device, which includes a substrate and a sensing memory device. The substrate includes a metal-oxide-semiconductor transistor having a gate. The sensing memory device is disposed on the gate of the metal-oxide-semiconductor transistor and includes a first conductive layer, a second conductive layer, a charge trapping layer, a first dielectric layer and a second dielectric layer. The second conductive layer is covering the first conductive layer. The charge trapping layer is disposed between the first conductive layer and the second conductive layer, wherein the first conductive layer has a sensing region therein when charges stored in the charge trapping layer, and the sensing region is adjacent to the charge trapping layer. The first dielectric layer and the second dielectric layer are respectively disposed between the charge trapping layer and the first conductive layer and between the charge trapping layer and the second conductive layer, wherein a third dielectric layer is disposed between the gate and the sensing memory device.

In view of the above, the semiconductor device provided by the present invention has not been found in the conventional technology, and it has a simple structure, thus improving the integration of the memory. Furthermore, the semiconductor device provided by the present invention may be applied in volatile and non-volatile memories.

In order to make the aforementioned and other objectives, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
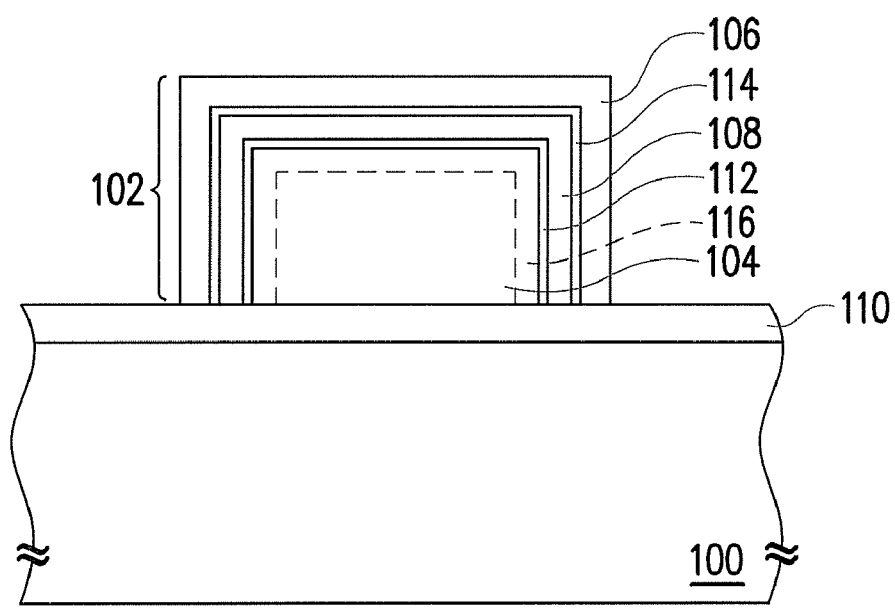
FIG. 1 is a cross-sectional view of a sensing memory device according to a first embodiment of the present invention.

FIG. 1 is a cross-sectional view of a sensing memory device according to a first embodiment of the present invention.

Referring to FIG. 1, the sensing memory device 102 is disposed on a substrate 100. The sensing memory device 102 includes a conductive layer 104, a conductive layer 106 and a charge trapping layer 108. Furthermore, a dielectric layer 110 can be disposed between the sensing memory device 102 and the substrate 100 for electrically isolating the sensing memory device 102 and the substrate 100, thereby preventing the current from flowing to the substrate 100 when measuring the resistance of the sensing memory device 102. The material of the dielectric layer 110 is, for example, silicon dioxide, and the forming method thereof is, for example, implanting oxygen ions on the substrate 100 in the way of ion-implantation, and then performing a thermal process for the substrate 100, or utilizing the method of chemical vapor deposition, or using an SOI substrate to form the dielectric layer 110.

The conductive layer 104 is disposed on the substrate 100. The material of the conductive layer 104 is a conductive material such as metal, metal compound or semiconductor (for example doped poly-silicon).

The conductive layer 106 covers the two side walls and the upper surface of the conductive layer 104. The material of the conductive layer 106 is a conductive material such as metal, metal compound or semiconductor.

The charge trapping layer 108 is disposed between the conductive layer 104 and the conductive layer 106. The charge trapping layer 108 is, for example, a silicon nitride layer, a doped poly-silicon layer, an aluminum oxide layer, a hafnium dioxide layer or a nanocrystalline layer.

Furthermore, a dielectric layer 112 and a dielectric layer 114 are respectively disposed between the charge trapping layer 108 and the conductive layer 104 and between the charge trapping layer 108 and the conductive layer 106, so as to ensure the charge conservation of the sensing memory device 102.

The simple structure of the sensing memory device 102 effectively improves the integration of the memory. Furthermore, the sensing memory device 102 can not only be applied in the volatile memory, but can also be applied in the non-volatile memory (for example a dynamic random access memory).

When the sensing memory device is programmed, the conductive layer 104 and the conductive layer 106 are both applied with a bias, and the charge is trapped in the charge trapping layer 108 by the F-N tunneling effect.

For being affected by the charges stored in the charge trapping layer 108, the conductive layer 104 forms a sensing region 116 in the region adjacent to the charge trapping layer 108. When the material of the conductive layer 104 is semiconductor, after being affected by the charges stored in the charge trapping layer 108, the conductive layer 104 forms a depletion region or an accumulation region in the region adjacent to the charge trapping layer 108, so as to form the sensing region 116. When the material of the conductive layer 104 is metal or metal compound, the charge distribution state of the conductive layer 104 is affected by the charges stored in the charge trapping layer 108, so as to form the sensing region 116. Therefore, the resistance of the conductive layer 104 changes for being affected by the charges stored in the charge trapping layer 108.

Therefore, whether or not there are charges stored in the charge trapping layer 108 can be determined by measuring the current of the conductive layer 104 or between the conductive layer 104 and the conductive layer 106. If the current changes for being affected by the sensing region 116, this indicates that there are charges stored in the charge trapping layer 108. On the contrary, if it is measured that the current of the conductive layer 104 or between the conductive layer 104 and the conductive layer 106 has no change, this indicates that there are no charges in the charge trapping layer 108.

After the charges stored in the charge trapping layer 108 being erased by the F-N tunneling effect, the sensing region 116 no longer exists, and the resistance of the conductive layer 104 recovers to the original state.

Figure 2:
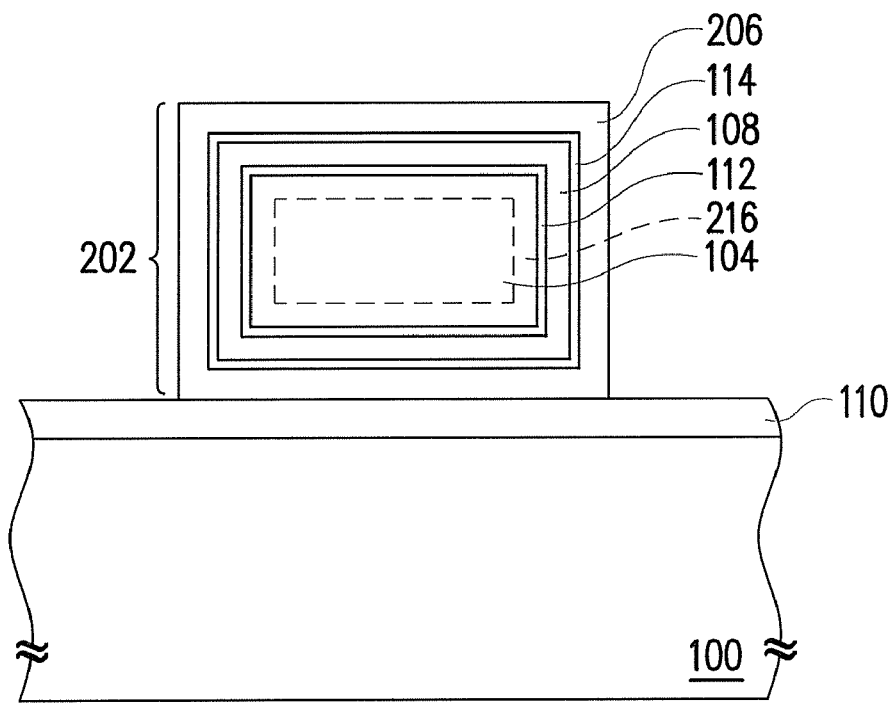
FIG. 2 is a cross-sectional view of the sensing memory device according to a second embodiment of the present invention.

FIG. 2 is a cross-sectional view of the sensing memory device according to a second embodiment of the present invention.

Referring to FIGS. 1 and 2 at the same time, a sensing memory device 202 in FIG. 2 is almost the same as the sensing memory device 102 in FIG. 1, the difference there-between lies in that, a conductive layer 206 of the sensing memory device 202 covers the two side walls, the upper surface and the lower surface of the conductive layer 104, so that a sensing region 216 of the sensing memory device 202 has a wider sensing range, and the performance is more preferable than the sensing memory device 102.

Figure 3:
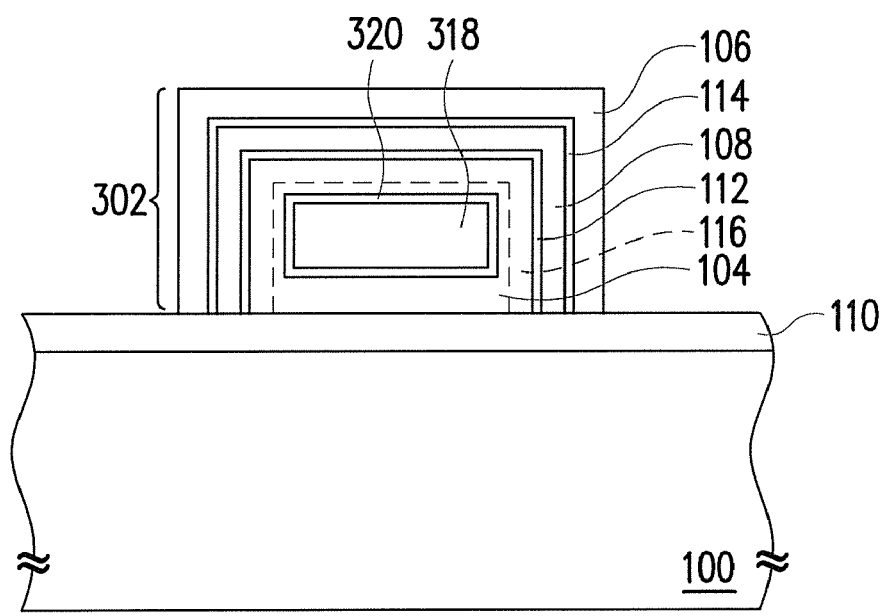
FIG. 3 is a cross-sectional view of the sensing memory device according to a third embodiment of the present invention.
Figure 4:
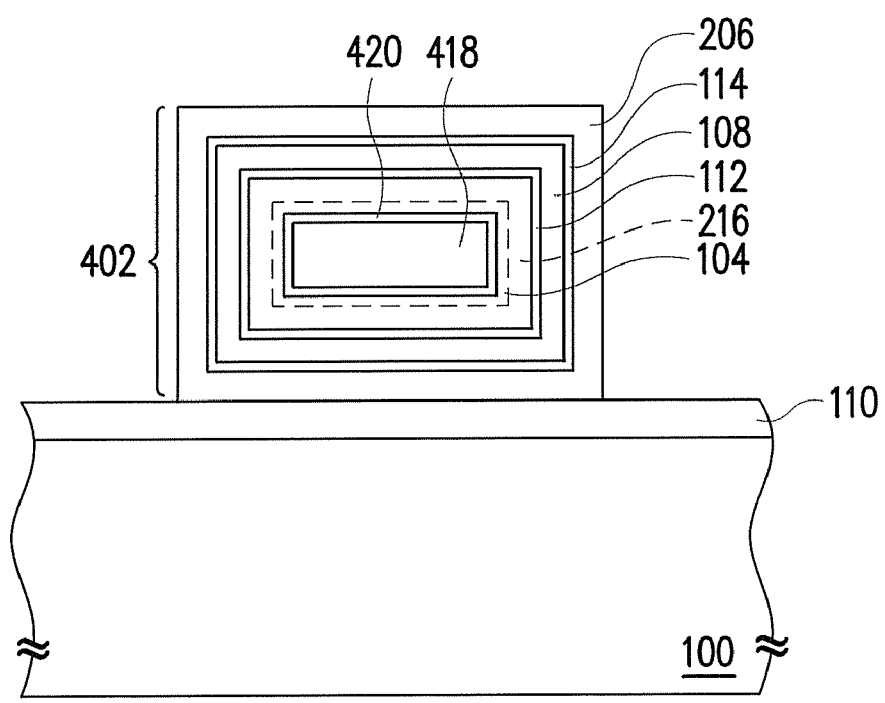
FIG. 4 is a cross-sectional view of the sensing memory device according to a forth embodiment of the present invention.

FIG. 3 is a cross-sectional view of the sensing memory device according to a third embodiment of the present invention. FIG. 4 is a cross-sectional view of the sensing memory device according to a forth embodiment of the present invention.

Referring to FIGS. 1, 2, 3 and 4 at the same time, sensing memory devices 302, 402 in FIGS. 3 and 4 are almost the same as the sensing memory devices 102, 202 in the FIGS. 1 and 2 respectively, and the difference there-between lies in that, conductive layers 318, 418 are respectively disposed in the sensing memory devices 302, 402. The material of the conductive layers 318, 418 is metal, metal compound or semiconductor.

If the resistances of the conductive layers 318, 418 are less than that of the conductive layer 104 when charge trapping layer 108 was charged, in the sensing memory devices 302, 402, dielectric layers 320, 420 are respectively disposed between the conductive layer 104 and the conductive layers 318, 418, so as to prevent the charges from flowing to the conductive layers 318, 418. Furthermore, if the resistances of the conductive layers 318, 418 are larger than that of the conductive layer 104 when charge trapping layer 108 was charged, it is not necessary to dispose the dielectric layers 320, 420 between the conductive layer 104 and the conductive layers 318, 418 respectively.

When there are charges stored in the charge trapping layer 108, the charges in the conductive layers 318, 418 and the charges of the charge trapping layer 108 produce a clipping effect to the charge distribution in the conductive layer 104, so as to further enhance the sensing intensity of the sensing regions 116, 216 more effectively.

Figure 5:
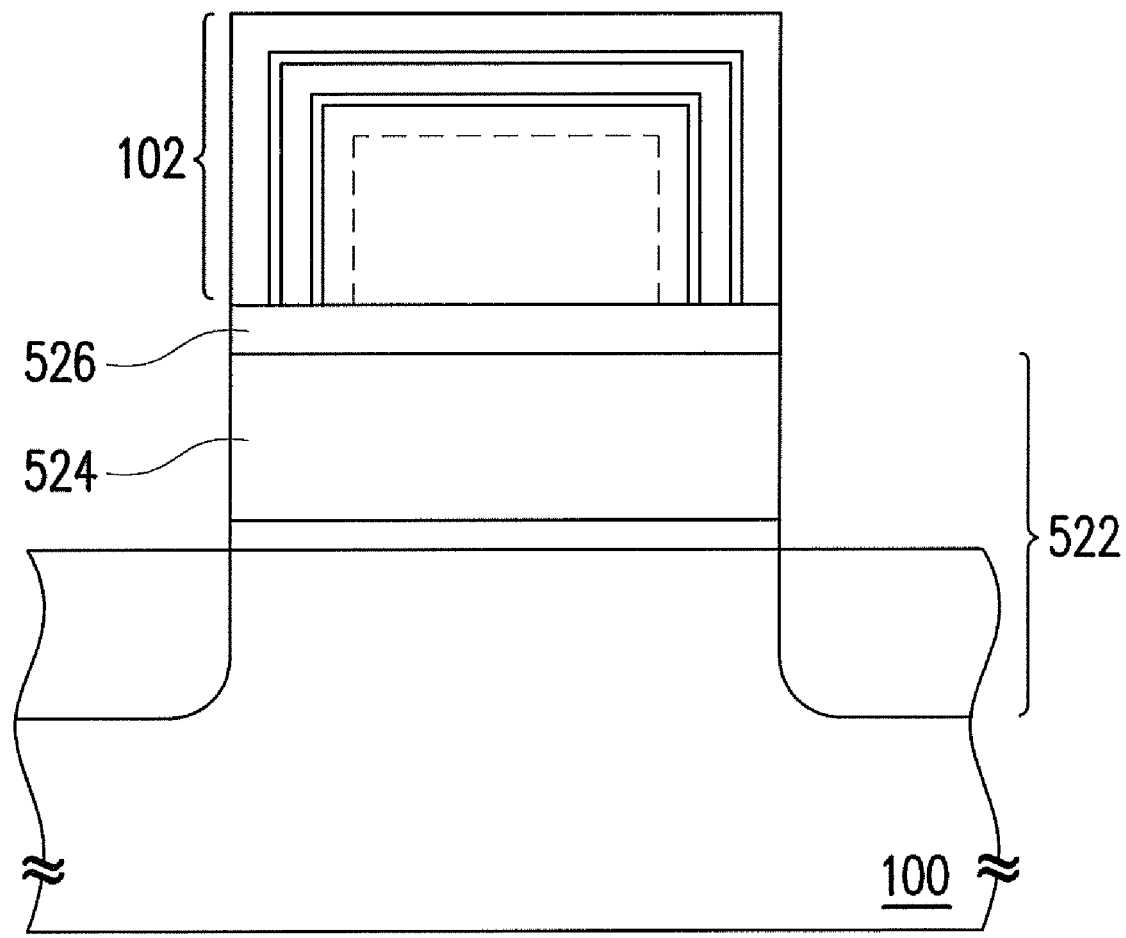
FIG. 5 is a cross-sectional view of the semiconductor device according to a fifth embodiment of the present invention.
Figure 6:
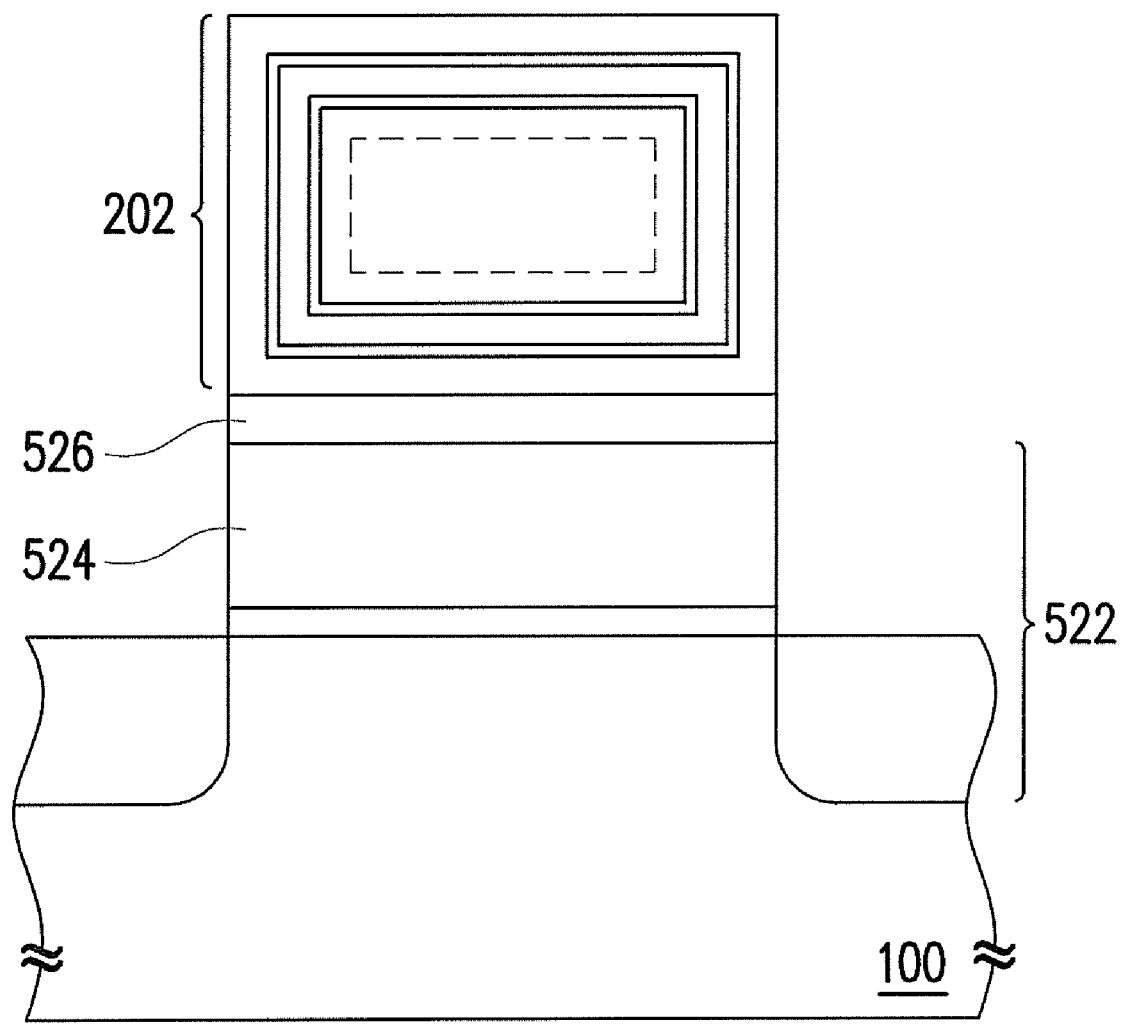
FIG. 6 is a cross-sectional view of the semiconductor device according to a sixth embodiment of the present invention.
Figure 7:
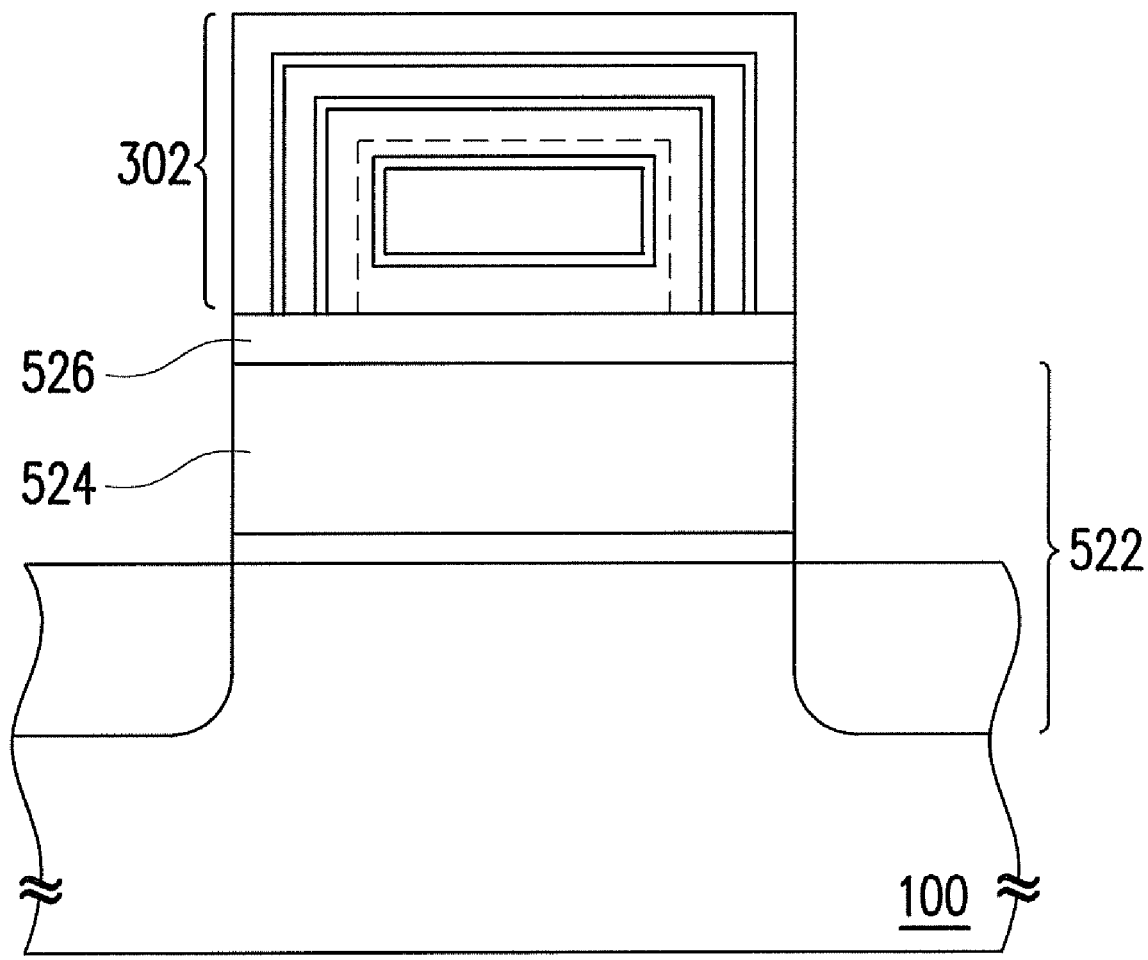
FIG. 7 is a cross-sectional view of the semiconductor device according to a seventh embodiment of the present invention.
Figure 8:
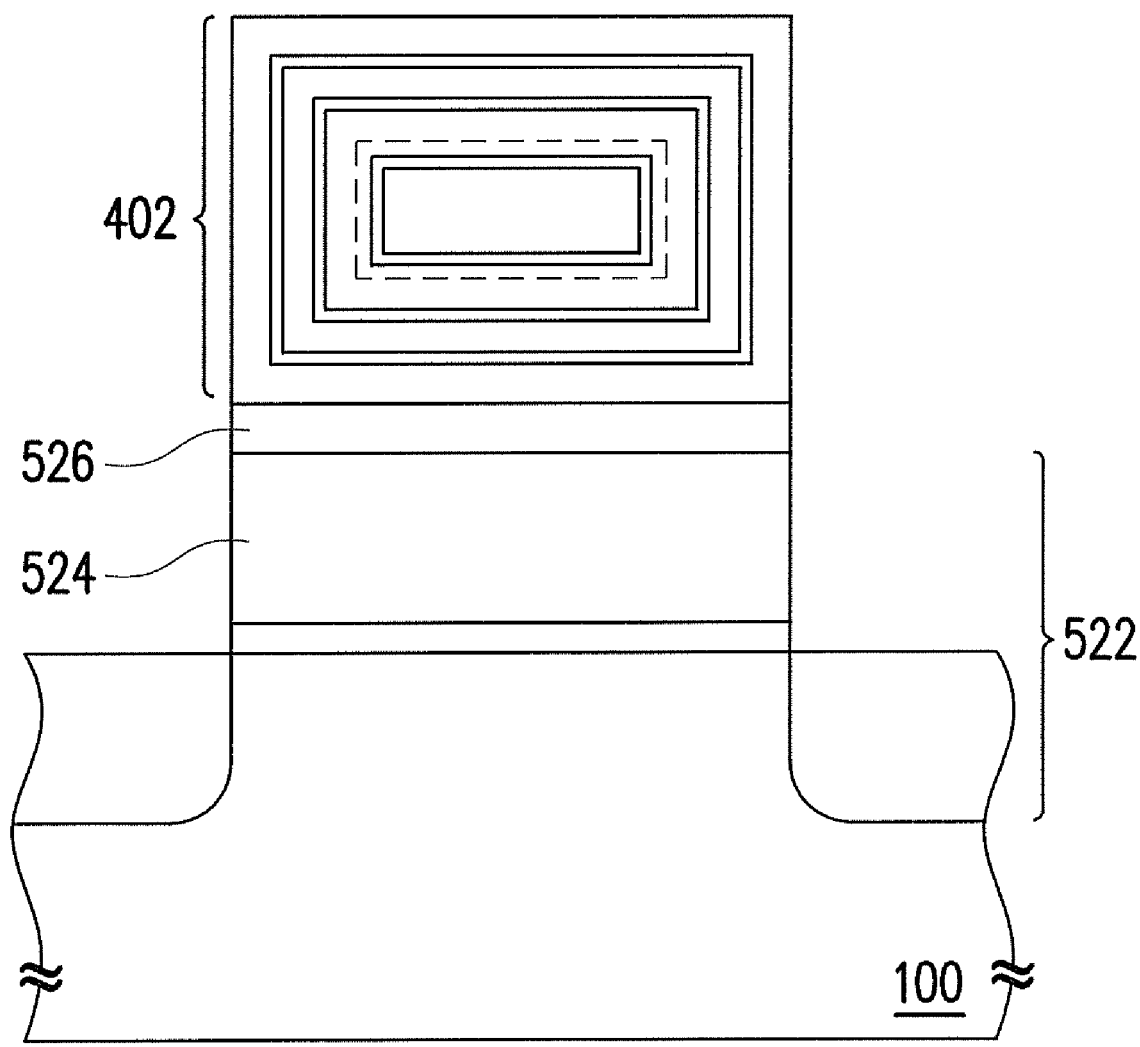
FIG. 8 is a cross-sectional view of the semiconductor device according to a eighth embodiment of the present invention.

FIG. 5 is a cross-sectional view of the semiconductor device according to a fifth embodiment of the present invention. FIG. 6 is a cross-sectional view of the semiconductor device according to a sixth embodiment of the present invention. FIG. 7 is a cross-sectional view of the semiconductor device according to a seventh embodiment of the present invention. FIG. 8 is a cross-sectional view of the semiconductor device according to an eighth embodiment of the present invention.

Referring to FIGS. 1 and 5 at the same time, the sensing memory device in FIG. 5 is the same as the sensing memory device 102 in FIG. 1, the difference there-between lies in that, the substrate 100 in FIG. 5 has a metal-oxide-semiconductor transistor 522 having a gate 524, the sensing memory device 102 is disposed on the gate 524, and a dielectric layer 526 is disposed between the sensing memory device 102 and the gate 524.

Since the sensing memory device 102 is disposed on the metal-oxide-semiconductor transistor 522, the integration of the memory is further improved. Likewise, the sensing memory devices 202, 302 and 402 in FIGS. 2, 3 and 4 also can be disposed on the metal-oxide-semiconductor transistor 522 (as shown in FIGS. 6, 7 and 8), so as to improve the integration, which will not be described in detail herein.

In view of the above, the present invention has at least the following advantages.

1. The semiconductor device provided by the present invention has a simple structure, and can effectively improve the integration of the memory when being used in the manufacture of the memory.

2. The semiconductor device provided by the present invention can be applied in volatile and non-volatile memories.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims and their equivalents.

What is claimed is:

1. A semiconductor device, disposed on a substrate, comprising:
   a substrate, comprising a metal-oxide-semiconductor transistor having a gate; and
   a sensing memory device, disposed on the gate of the metal-oxide-semiconductor transistor and comprising:
      a first conductive layer;
      a second conductive layer, covering the first conductive layer;
      a charge trapping layer, disposed between the first conductive layer and the second conductive layer, wherein the first conductive layer has a sensing region therein when charges stored in the charge trapping layer, and the sensing region is adjacent to the charge trapping layer; and
      a first dielectric layer and a second dielectric layer respectively disposed between the charge trapping layer and the first conductive layer and between the charge trapping layer and the second conductive layer, wherein a third dielectric layer is disposed between the gate and the sensing memory device.

2. The semiconductor device as claimed in claim 1, wherein the second conductive layer covers the two side walls and the upper surface of the first conductive layer.

3. The semiconductor device as claimed in claim 1, wherein the second conductive layer covers the two side walls, the upper surface and the lower surface of the first conductive layer.

4. The semiconductor device as claimed in claim 1, wherein the substrate comprises a substrate of silicon on insulation (SOI).

5. The semiconductor device as claimed in claim 1, wherein the material of the first conductive layer comprises metal, metal compound or semiconductor.

6. The semiconductor device as claimed in claim 1, wherein the material of the second conductive layer comprises metal, metal compound or semiconductor.

7. The semiconductor device as claimed in claim 1, wherein the charge trapping layer comprises a silicon nitride layer, a doped poly-silicon layer, an aluminum oxide layer, a hafnium dioxide layer or a nanocrystalline layer.

8. The semiconductor device as claimed in claim 1, further comprising a third conductive layer disposed in the first conductive layer.

9. The semiconductor device as claimed in claim 8, wherein the second conductive layer covers the two side walls and the upper surface of the first conductive layer.

10. The semiconductor device as claimed in claim 8, wherein the second conductive layer covers the two side walls, the upper surface and the lower surface of the first conductive layer.

11. The semiconductor device as claimed in claim 8, wherein the resistance of the third conductive layer is larger than that of the first conductive layer when charge trapping layer was charged.

12. The semiconductor device as claimed in claim 8, when the resistance of the third conductive layer is less than that of the first conductive layer when charge trapping layer was charged, the sensing memory device further comprising a fourth dielectric layer disposed between the first conductive layer and the third conductive layer.

13. The semiconductor device as claimed in claim 8, wherein the substrate comprises a substrate of silicon on insulation (SOI).

14. The semiconductor device as claimed in claim 8, wherein the material of the first conductive layer comprises metal, metal compound or semiconductor.

15. The semiconductor device as claimed in claim 8, wherein the material of the second conductive layer comprises metal, metal compound or semiconductor.

16. The semiconductor device as claimed in claim 8, wherein the material of the third conductive layer comprises metal, metal compound or semiconductor.

17. The semiconductor device as claimed in claim 8, wherein the charge trapping layer comprises a silicon nitride layer, a doped poly-silicon layer, an aluminum oxide layer, a hafnium dioxide layer or a nanocrystalline layer.

* * * * *